US009070656B2

(12) United States Patent
Hooper et al.

(10) Patent No.: US 9,070,656 B2
(45) Date of Patent: Jun. 30, 2015

(54) UNDERFILL-ACCOMMODATING HEAT SPREADERS AND RELATED SEMICONDUCTOR DEVICE ASSEMBLIES AND METHODS

(71) Applicant: Micron Technology, Inc., Boise, ID (US)

(72) Inventors: Andy E. Hooper, Boise, ID (US); Xiao Li, Boise, ID (US); Shijian Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 13/915,778

(22) Filed: Jun. 12, 2013

(65) Prior Publication Data

US 2014/0367844 A1    Dec. 18, 2014

(51) Int. Cl.
| | |
|---|---|
| H01L 23/34 | (2006.01) |
| H01L 23/36 | (2006.01) |
| H01L 23/10 | (2006.01) |
| H01L 23/367 | (2006.01) |
| H01L 21/56 | (2006.01) |
| H01L 25/065 | (2006.01) |
| H01L 23/00 | (2006.01) |

(52) U.S. Cl.
CPC ............. *H01L 23/36* (2013.01); *H01L 23/10* (2013.01); *H01L 23/3675* (2013.01); *H01L 21/563* (2013.01); *H01L 24/16* (2013.01); *H01L 24/32* (2013.01); *H01L 24/73* (2013.01); *H01L 24/83* (2013.01); *H01L 25/0657* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/73253* (2013.01); *H01L 2224/83385* (2013.01); *H01L 2225/06517* (2013.01); *H01L 2225/06589* (2013.01); *H01L 2924/16251* (2013.01); *H01L 2225/06513* (2013.01); *H01L 2225/06568* (2013.01)

(58) Field of Classification Search
CPC ....................................................... H01L 23/36
USPC .......................................... 257/707; 438/125
See application file for complete search history.

(56) References Cited

U.S. PATENT DOCUMENTS

| | | | |
|---|---|---|---|
| 6,617,683 B2 | 9/2003 | Lebonheur et al. | |
| 7,081,669 B2 | 7/2006 | Fitzgerald et al. | |
| 7,223,638 B2 * | 5/2007 | Starkston | 438/122 |
| 7,439,617 B2 | 10/2008 | Deppisch et al. | |
| 2012/0061852 A1 * | 3/2012 | Su et al. | 257/777 |

* cited by examiner

*Primary Examiner* — Long K Tran
(74) *Attorney, Agent, or Firm* — TraskBritt

(57) ABSTRACT

Heat spreaders for dissipating heat from semiconductor devices comprise a contact surface located within a recess on an underside of the heat spreader, the contact surface being configured to physically and thermally attach to a semiconductor device, and a trench extending into the heat spreader adjacent to the contact surface sized and configured to receive underfill material extending from the semiconductor device into the trench. Related semiconductor device assemblies may include these heat spreaders and methods may include physically and thermally attaching these heat spreaders to semiconductor devices such that underfill material extends from a semiconductor device into the trench.

20 Claims, 5 Drawing Sheets

UNDERFILL-ACCOMMODATING HEAT SPREADERS AND RELATED SEMICONDUCTOR DEVICE ASSEMBLIES AND METHODS

FIELD

The disclosure relates generally to heat spreaders for semiconductor devices. More specifically, disclosed embodiments relate to heat spreaders configured to accommodate excess underfill material used with semiconductor device assemblies, and to related semiconductor device assemblies and methods.

BACKGROUND

When in use, semiconductor devices and semiconductor device assemblies generate significant heat. When thermal management techniques used to conduct heat away from semiconductor devices are inadequate, the resulting temperatures may degrade performance of such semiconductor devices, may degrade performance of other components near such semiconductor devices, may damage such semiconductor devices, may damage other components near such semiconductor devices, and may even injure a user near that semiconductor device. As examples of thermal management, U.S. Pat. No. 6,617,683, issued Sep. 9, 2003, titled "THERMAL PERFORMANCE IN FLIP CHIP/INTEGRAL HEAT SPREADER PACKAGES USING LOW MODULUS THERMAL INTERFACE MATERIAL," discloses a heat spreader in the form of a lid that is mounted to a flip chip die, by way of a thermal interface material (TIM) between the heat spreader and the flip chip die, and to a substrate to which the flip chip die is attached, by way of a sealant, so as to extend over and around the flip chip die. U.S. Pat. No. 7,081,669, issued Jul. 25, 2006, titled "DEVICE AND SYSTEM FOR HEAT SPREADER WITH CONTROLLER THERMAL EXPANSION," discloses a similar heat spreader, which is composed of an insert of high thermal conductivity material that expands when heated and a ring of a stiff material that expands to a lesser degree when heated. U.S. Pat. No. 7,439,617, issued Oct. 21, 2008, titled "CAPILLARY UNDERFLOW INTEGRAL HEAT SPREADER," discloses a heat spreader including solder wettable material, which may be located in a concavity formed in a mating surface of the heat spreader, which may be melted and pulled by capillary action through a narrow space between a chip and the heat spreader to avoid void formation.

BRIEF DESCRIPTION OF THE DRAWINGS

While the disclosure concludes with claims particularly pointing out and distinctly claiming specific embodiments, various features and advantages of embodiments of the disclosure may be more readily ascertained from the following description when read in conjunction with the accompanying drawings, in which:

DETAILED DESCRIPTION

The illustrations presented herein are not meant to be actual views of any particular heat spreader, assembly including a heat spreader, or component thereof, but are merely idealized representations employed to describe illustrative embodiments. Thus, the drawings are not necessarily to scale.

Disclosed embodiments relate generally to heat spreaders that may accommodate excess underfill material used with semiconductor devices. More specifically, disclosed are embodiments of heat spreaders that may include trenches within which excess underfill material may be accommodated. As used herein, the term "heat spreader" means and includes any element or portion thereof to be placed in thermal contact with a portion of a semiconductor device assembly for transfer of heat from the semiconductor device assembly. For example, heat spreaders include heat exchangers, heat sinks, heat pipes, and cooling plates.

Figure 1:
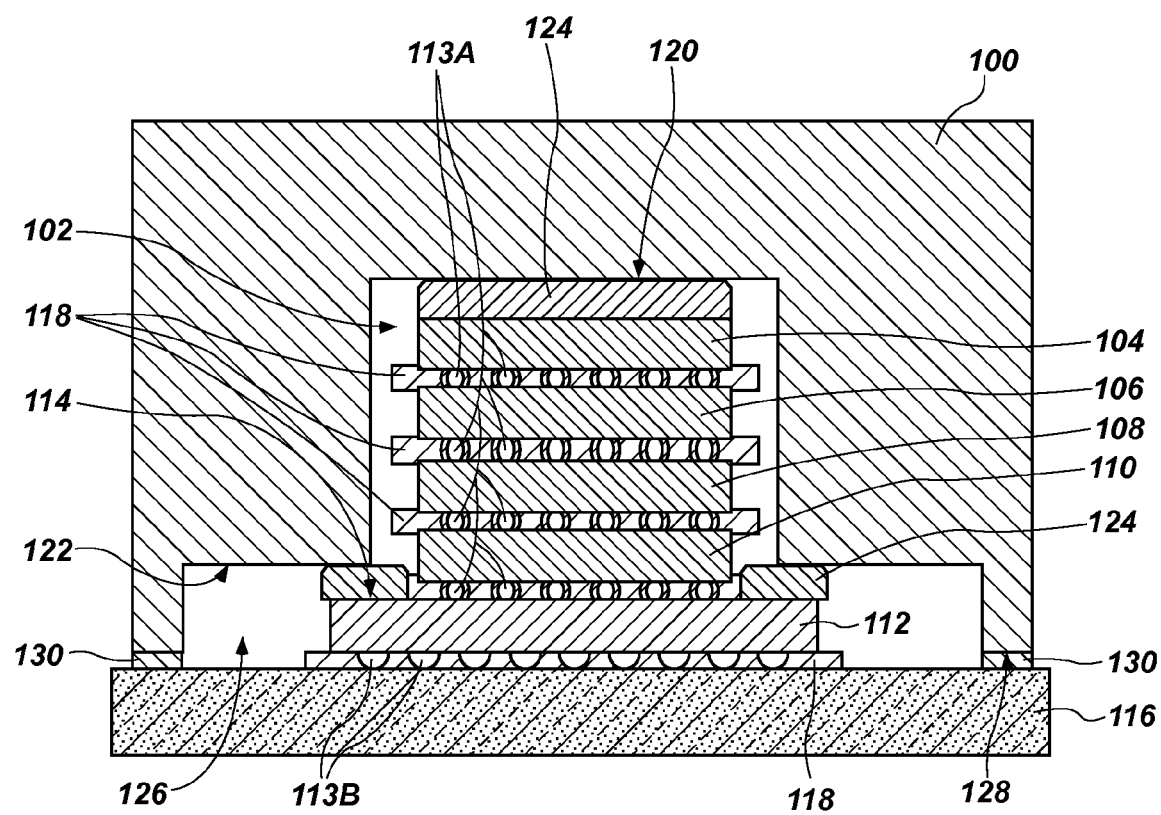
FIG. 1 is a cross-sectional view of a heat spreader attached to a semiconductor device assembly.

Referring to FIG. 1, a cross-sectional view of a heat spreader 100 physically and thermally attached to a semiconductor device assembly 102 is shown. The semiconductor device assembly 102 may comprise a stack of semiconductor devices 104, 106, 108, 110, and 112 physically and electrically attached to one another by discrete conductive elements 113A, for example copper pillars. A lowermost semiconductor device 112 may have a larger footprint than the other semiconductor devices 104, 106, 108, and 110 in the stack. More specifically, the lowermost semiconductor device 112 may include a laterally protruding portion 114, termed a "porch," extending laterally beyond the other semiconductor devices 104, 106, 108, and 110 in the stack. The lowermost semiconductor device 112 may be physically and electrically attached to a substrate 116 by discrete conductive elements 113B, for example solder balls or bumps or conductive or conductor-filled epoxy elements. Underfill material 118 may be located between adjacent semiconductor devices 104, 106, 108, 110, and 112 and around and between discrete conductive elements 113A. Underfill material 118 may also be located between the lowermost semiconductor device 112 and the substrate 116 in some embodiments.

The heat spreader 100 includes a first contact surface 120 and a second contact surface 122 for physically and thermally attaching the heat spreader 100 to the semiconductor device assembly 102. More specifically, the first contact surface 120 may be physically and thermally attached to the uppermost semiconductor device 104 and the second contact surface 122 may be physically and thermally attached to the laterally protruding portion 114 of the lowermost semiconductor device 112. A TIM 124 may be located between the semiconductor devices 104 and 112 and respective associated first and second contact surfaces 120 and 122. The first and second contact surfaces 120 and 122 and the semiconductor device assembly 102 may be located within a recess 126 on an underside 128 of the heat spreader 100. The semiconductor device assembly 102 may be peripherally sealed (e.g., hermetically sealed or simply mechanically secured without forming a hermetic seal) within the recess 126 by attaching the heat spreader 100 to the substrate 116 using, for example, a sealant material 130.

A challenge in fabrication of semiconductor device assemblies, particularly assemblies including multiple, stacked devices, is providing sufficient volume of underfill material between the stacked devices to avoid formation of voids between the devices and between and around the discrete conductive elements, while avoiding an excess volume of underfill material, which may compromise effective thermal contact between the stacked devices and an associated heat sink member, such as a heat spreader. Some underfill materials, such as, for example, capillary underfills, attempt to reduce void formation using capillary action to flow between the semiconductor devices. Application of these underfill materials is time-consuming because they flow slowly, and sufficient time must pass for them to completely fill the spaces between semiconductor devices and among discrete conductive elements. In addition, any excess capillary underfill tends to flow down the sides of the stack, forming a pyramid-shaped buildup around the stack, which may interfere with attachment to a heat spreader.

Figure 2:
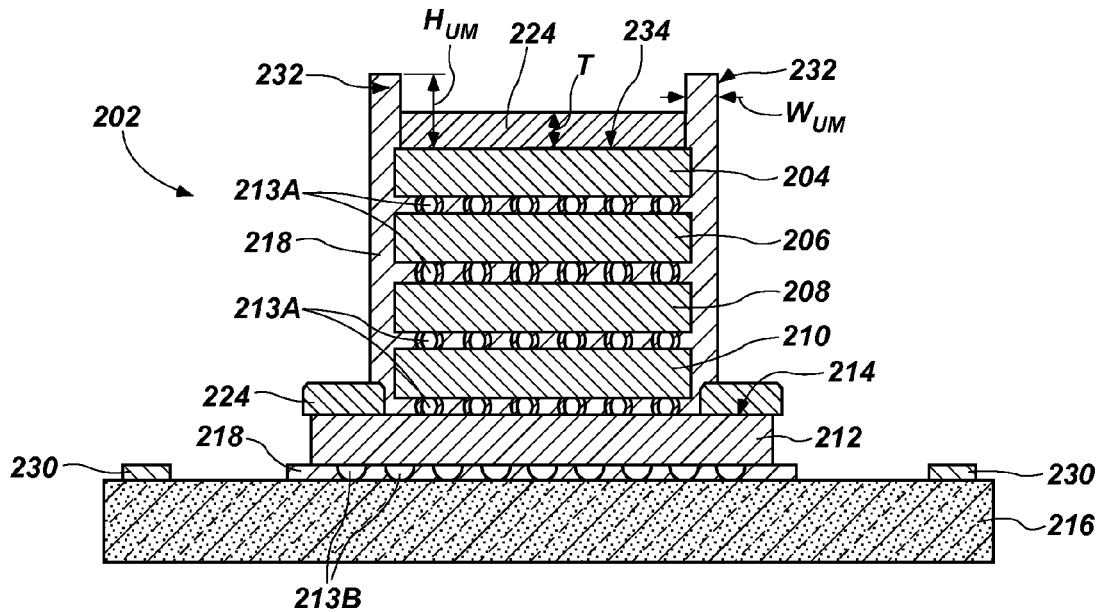
FIG. 2 is similar to FIG. 1, but illustrates an assembly including excess underfill material.

Referring to FIG. 2, a cross-sectional view of a semiconductor device assembly 202 including excess underfill material 218 is shown. The underfill material 218 may be a non-capillary underfill material, such as, for example, non-conductive paste or wafer-level underfill (e.g., in the form of paste or film), which is located between adjacent semiconductor devices 204, 206, 208, 210, and 212 and extends about discrete conductive elements 213A that physically and electrically connect the semiconductor devices 204, 206, 208, 210, and 212 to one another. As with the semiconductor device assembly 102 of FIG. 1, semiconductor devices 204, 206, 208 and 210 may be of the same or similar shape and size, while semiconductor device 212 may include a laterally protruding portion 214 extending beyond a periphery of the semiconductor devices 204, 206, 208 and 210 stacked thereon. The underfill material 218 may be more viscous and exhibit a higher surface tension than capillary underfill materials. To reduce the likelihood that voids will remain between adjacent semiconductor devices 204, 206, 208, 210, and 212, the quantity of underfill material 218 initially placed between the semiconductor devices 204, 206, 208, 210, and 212 may be selected to exceed an expected final volume of space between semiconductor devices 204, 206, 208, 210, and 212 and within a lateral periphery of stacked semiconductor devices 204, 206, 208 and 210 above semiconductor device 212 at the base of the stack. For example, the underfill material 218 may be dispensed onto a surface of a semiconductor device 212, 210, 208, or 206 using a syringe or a sheet of the underfill material 218 may be placed onto a surface of a semiconductor device 212, 210, 208, or 206 as the respective semiconductor devices 204, 206, 208, 210, and 212 are stacked, after which a next adjacent semiconductor device 210, 208, 206, or 204 may be placed onto the underfill material 218. Vertical compression (e.g., perpendicular to major planes of the semiconductor devices 204, 206, 208, 210, and 212) and/or heat may then be applied to the stack of semiconductor devices 204, 206, 208, 210, and 212 to physically and electrically attach the semiconductor devices 204, 206, 208, 210, and 212 to one another with discrete conductive elements 213A, which may cause the excess underfill material 218 to flow laterally beyond the periphery of stacked semiconductor devices 204, 206, 208, and 210.

Excess volumes of underfill material 218 of the type described previously herein may, contrary to an expectation of downward flow under gravity, flow upward along the sides of the stack of semiconductor devices 204, 206, 208, and 210, particularly in embodiments where the individual semiconductor devices 204, 206, 208, and 210 are thin. The excess volume of underfill material 218 may form columns 232 (e.g., elongated sections of underfill material 218) extending above an upper surface 234 of the uppermost semiconductor device 204. A height $H_{UM}$ of the columns 232 of excess underfill material 218 extending above the upper surface 234 may be greater than a thickness T of the thermal interface material (TIM) 224 on the upper surface 234 in some embodiments. For example, the height $H_{UM}$ of the excess underfill material 218 extending above the upper surface 234 may be between about 20 μm and about 400 μm. More specifically, the height $H_{UM}$ of the excess underfill material 218 extending above the upper surface 234 may be between about 50 μm and about 100 μm (e.g., about 80 μm). The thickness T of the TIM 224 may be, for example, between about 5 μm and about 100 μm. More specifically, the thickness T of the TIM 224 may be, for example, between about 25 μm and about 80 μm (e.g., about 50 μm). A width $W_{UM}$ of the excess underfill material 218 extending above the upper surface 234 and measured laterally outward from a lateral periphery of the stack of semiconductor devices 204, 206, 208, and 210 may be about 300 μm or less. More specifically, the width $W_{UM}$ of the excess underfill material 218 extending above the upper surface 234 may be about 500 μm or less (e.g., about 300 μm or less, about 200 μm or less, about 100 μm or less, or even less).

Figure 3:
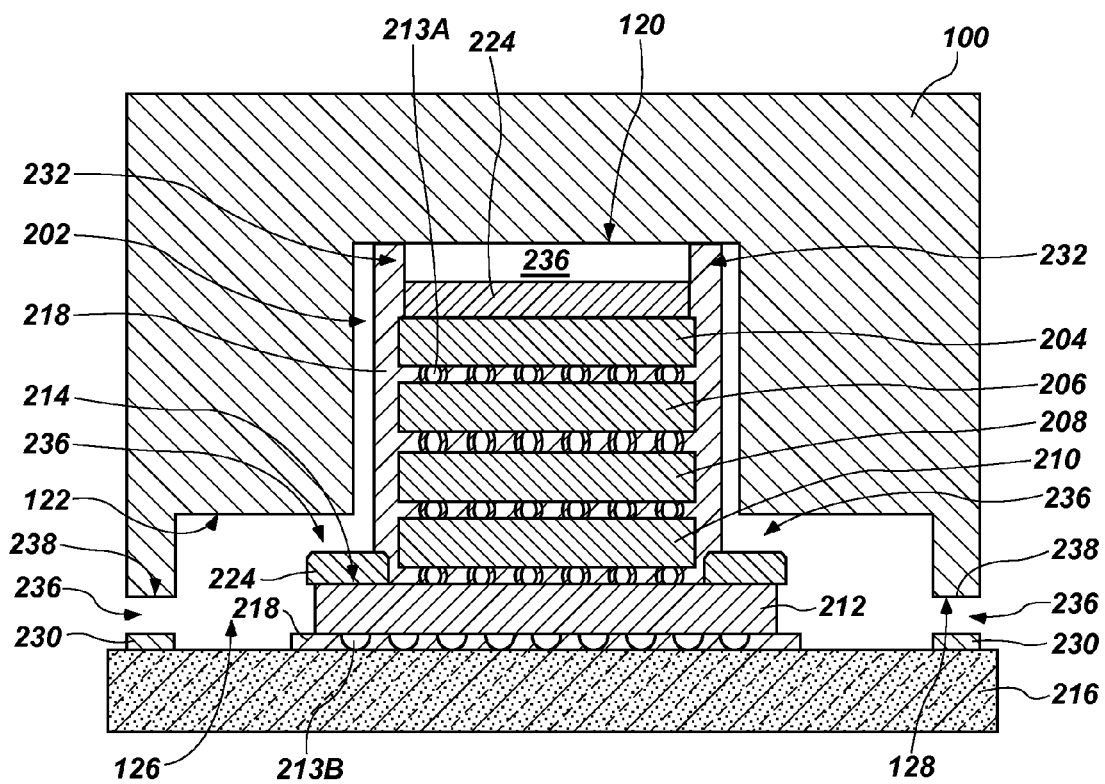
FIG. 3 is a cross-sectional view of the assembly of FIG. 2 with the heat spreader of FIG. 1.

Referring to FIG. 3, a cross-sectional view of a heat spreader 100 as illustrated and described with respect to FIG. 1, in combination with the semiconductor device assembly 202 of FIG. 2 is shown. The columns 232 of excess underfill material 218 may interfere with the ability of the heat spreader 100 to physically and thermally attach to the semiconductor devices 204 and 212 through TIM 224, and to physically attach to a substrate 216 through sealant 230 to seal the semiconductor device assembly 202 within the recess 126. For example, the first contact surface 120 of the heat spreader 100 may contact the columns 232 of underfill material 218 before it is able to physically and thermally attach to the uppermost semiconductor device 204 (e.g., before it contacts the TIM 224). As the heat spreader 100 is supported on the columns 232, a void 236 may be left between each of the first contact surface 120 and the uppermost semiconductor device 204, the second contact surface 122 and the lowermost semiconductor device 212, and attachment surfaces 238 of the heat spreader 100 and the substrate 216. Because the heat spreader 100 is unable to make adequate contact with the semiconductor devices 204 and 212 and with the substrate 216, it may not adequately dissipate heat and keep environmental contaminants out of the recess 126.

Figure 4:
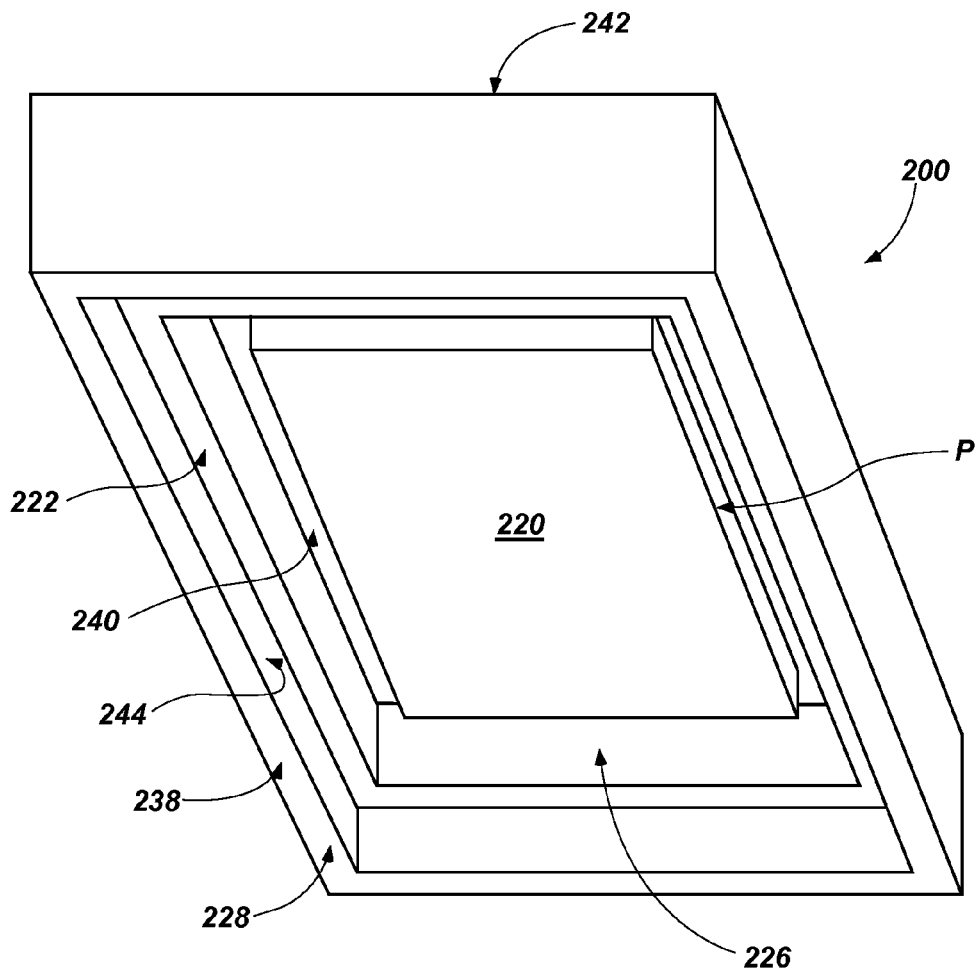
FIG. 4 is a perspective view of a heat spreader according to the present disclosure.

Referring to FIG. 4, a perspective view of a heat spreader 200 according to an embodiment of the present disclosure is shown. The heat spreader 200 includes at least one trench 240 sized and configured to receive the excess underfill material 218 (see FIG. 6) extending upward from the semiconductor device 204 into the trench 240. The trench 240 may be adjacent to the first contact surface 220, which may be sized and configured to contact an upper surface 234 (see FIG. 6) of a semiconductor device 204 (see FIG. 6) through TIM 224 (see FIG. 6). The trench 240 may extend from the first contact surface 220 into the heat spreader 200 toward a topside 242 of the heat spreader 200. The trench 240 may extend around a perimeter P of the first contact surface 220. A shape defined by the perimeter P of the first contact surface 220, and a corresponding shape of the trench 240, may match a peripheral shape of the semiconductor device 204 to which the first contact surface 220 is configured to be attached. For example, the peripheral shape defined by the perimeter P of the first contact surface 220, and the corresponding shape of the trench 240, may be rectangular, square, circular, polygonal, etc.

The heat spreader 200 may include a stepped, second contact surface 222 configured to contact a laterally protruding portion 214 (e.g., porch) of another semiconductor device 212. The first and second contact surfaces 220 and 222 and the trench 240 may be located within a recess 226 on an underside 228 of the heat spreader 200. The heat spreader 200 may include attachment legs 244 extending downward from the second contact surface 222 to define attachment surfaces 238 configured to be attached to a substrate 216 (see FIG. 6) to seal a semiconductor device assembly 202 (see FIG. 6) within the recess 226.

Figure 5:
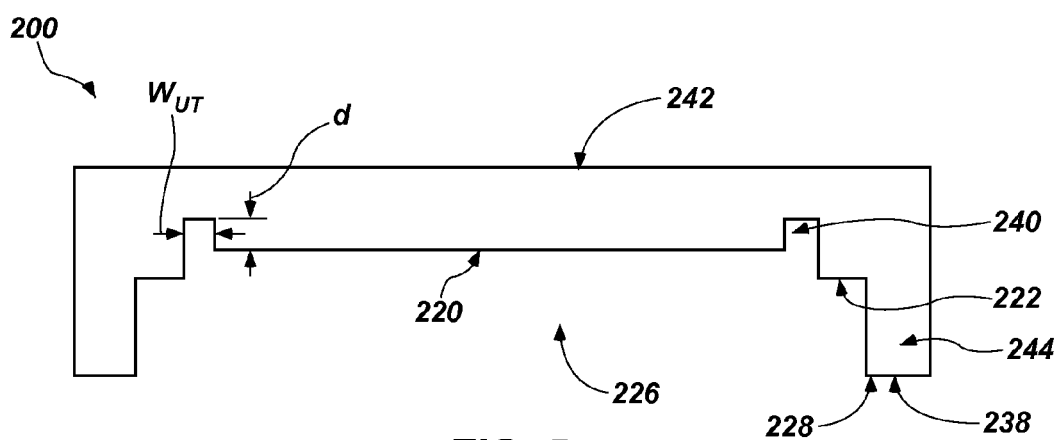
FIG. 5 is a cross-sectional view of the heat spreader of FIG. 4.

Referring to FIG. 5, a cross-sectional view of the heat spreader 200 of FIG. 4 is shown. The trench 240 may be sized to accommodate columns 232 (see FIG. 6) of excess underfill material 218 (see FIG. 6). More specifically, a depth d of the trench 240 as measured in a direction extending at least substantially perpendicular to the contact surface 220 may be greater than or equal to (or, if the underfill material 218 is compressible, even slightly less than) the height $H_{UM}$ (see FIG. 2) of the columns 232 (see FIG. 6) of excess underfill material 218 (see FIG. 6), less the thickness T (see FIG. 2) of the TIM 224 (see FIG. 6). For example, the depth d of the trench 240 may be greater than about 100 μm. More specifically, the depth d of the trench 240 may be greater than about 200 μm (e.g., about 300 μm or more, 400 μm or more, or even greater). Further, a width $W_{UT}$ of the trench 240 as measured in a direction extending at least substantially parallel to the contact surface 220 may be greater than or equal to the width $W_{UM}$ (see FIG. 2) of the underfill material 218 (see FIG. 6) extending above the semiconductor device 204 (see FIG. 6). The width $W_{UT}$ of the trench 240 may be, for example, less than 800 μm. More specifically, the width $W_{UT}$ of the trench 240 may be, for example, between about 100 μm and about 600 μm. As a specific, nonlimiting example, the width $W_{UT}$ of the trench 240 may be between about 200 μm and about 400 μm. The trench 240 may exhibit any cross-sectional shape sufficient to accommodate the excess underfill material 218 (see FIG. 6) extending from the semiconductor device 204 (see FIG. 6). For example, the cross-sectional shape of the trench 240 may be rectangular (e.g., square), obround, semicircular, etc.

A material of the heat spreader 200 may exhibit a high thermal conductivity. For example, the material of the heat spreader 200 may be copper, nickel, aluminum, beryllium oxide, silicon carbide, dymalloy, graphite, diamond or combinations, compounds, and alloys of these materials, as appropriate. As a specific, nonlimiting example, the heat spreader 200 may comprise nickel-plated copper. The thermal conductivity of the heat spreader 200 may be, for example, between about 180 W/m·K and about 2,000 W/m·K (e.g., about 400 W/m·K). The heat spreader 200 and its various features may be formed using conventional manufacturing techniques (e.g., milling, casting, sintering, extruding, molding, a die and press, laser cutting and drilling, etc.).

Accordingly, one embodiment of a heat spreader for dissipating heat from a semiconductor device assembly comprises a contact surface located within a recess on an underside of the heat spreader. The contact surface is configured to physically and thermally attach to an adjacent semiconductor device. A trench is adjacent to the contact surface, the trench extending into the heat spreader toward a topside of the heat spreader, the trench being sized and configured to receive underfill material extending from the semiconductor device assembly above the adjacent semiconductor device into the trench.

Figure 6:
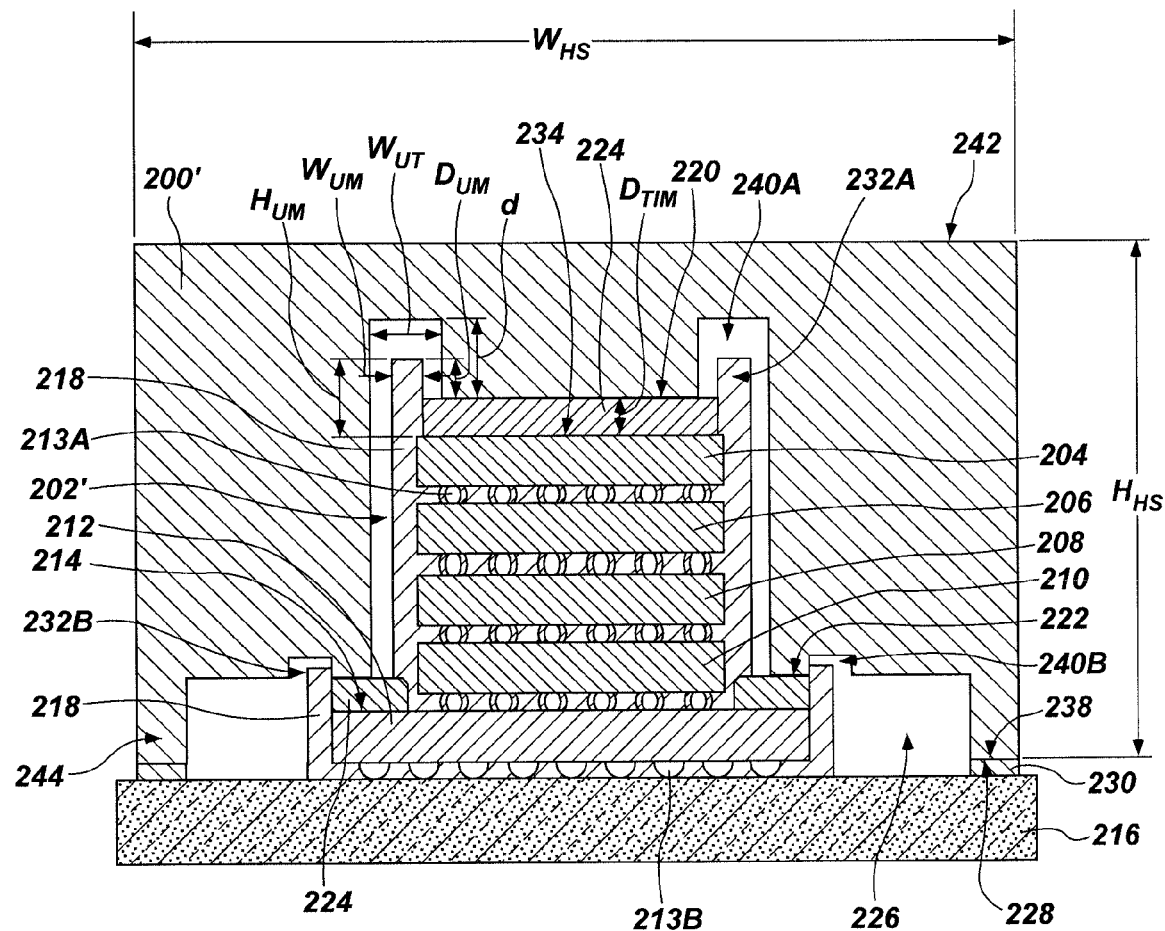
FIG. 6 is a cross-sectional view of another embodiment of a heat spreader according to the present disclosure attached to a semiconductor device assembly.

Referring to FIG. 6, a cross-sectional view of another embodiment of a heat spreader 200' attached to a semiconductor device assembly 202' is shown. The semiconductor device assembly 202' may include a stack of semiconductor devices 204, 206, 208, 210, and 212 in some embodiments. For example, the semiconductor device assembly 202' may include an uppermost semiconductor device 204, a lowermost semiconductor device 212, and semiconductor devices 206, 208, and 210 stacked with one another between the uppermost semiconductor device 204 and the lowermost semiconductor device 212. More specifically, the semiconductor device assembly 202' may include, for example, a series of semiconductor devices 204, 206, 208, and 210 having the same footprint (e.g., the same surface area for surfaces facing downward) stacked on another semiconductor device 212 having a larger footprint, wherein a laterally protruding portion 214 of the larger semiconductor device 212 extends laterally beyond the remaining semiconductor devices 204, 206, 208, and 210. The footprint of the smaller semiconductor devices 204, 206, 208, and 210 may be, for example, about 6 mm by about 9 mm, and the footprint of the larger semiconductor device 212 may be, for example, about 11 mm by about 13 mm, making a width of the laterally protruding portion 214 of the larger semiconductor device 212 extending laterally beyond the remaining semiconductor devices 204, 206, 208, and 210 about 2 mm.

As a specific, nonlimiting example, the semiconductor device assembly 202' may include a series of memory semiconductor devices 204, 206, 208, and 210 (e.g., dynamic random access memory (DRAM) chips) stacked on a logic semiconductor device 212 (e.g., a flip-chip type complementary metal-oxide-semiconductor (CMOS) control chip die). As another example, the semiconductor device assembly 202' may include a single semiconductor device 204 stacked directly on another semiconductor device 212 having a larger footprint. The semiconductor devices 204, 206, 208, 210, and 212 may be electrically interconnected using, for example, the aforementioned discrete conductive elements 213A in combination with through-silicon vias (TSVs) extending through semiconductor devices 206, 208, 210 and 212. In further embodiments, more than four memory semiconductor devices may be employed in a stack, and in still further embodiments semiconductor device 212 may comprise a system on a chip (SOC) die. In yet other embodiments, the semiconductor device assembly 202' may include a single semiconductor device 204. The semiconductor device assembly 202' may be physically and electrically attached to a substrate 216. Underfill material 218 may be located between adjacent semiconductor devices 204, 206, 208, 210, and 212. Excess underfill material 218 may extend upward, above upper surfaces of the uppermost semiconductor device 204 and the lowermost semiconductor device 212. For example, columns 232A (e.g., in the form of a narrow strip of underfill material 218 material extending around a perimeter of the uppermost semiconductor device 204) may extend above the upper surface 234 of the uppermost semiconductor device 204 In some embodiments, an underfill material 218 may be employed between semiconductor device 212 and substrate 216, and in such an instance columns 232B (e.g., in the form of a narrow strip of excess underfill material 218 material extending around a perimeter of the lowermost semiconductor device 212) may extend above the laterally protruding portion 214 of the lowermost semiconductor device 204. The underfill material 218 may exhibit a higher viscosity and a higher surface tension than conventional capillary underfill materials. The underfill material 218 may be, for example, a non-conductive paste (e.g., epoxy-based) or a wafer-level underfill (e.g., plastics). The underfill material 218 may exhibit a low thermal conductivity. For example, the thermal conductivity of the underfill material 218 may be less than about 1 W/m·K. More specifically, the thermal conductivity of the underfill material 218 may be less than about 0.75 W/m·K (e.g., about 0.5 W/m·K).

The heat spreader 200' may be physically and thermally attached to the semiconductor device assembly 202'. For example, the first contact surface 220 of the heat spreader 200' may be physically and thermally attached to the upper surface 234 of the uppermost semiconductor device 204, and the stepped, second contact surface 222 of the heat spreader 200' may be physically and thermally attached to the laterally protruding portion 214 of the lowermost semiconductor device 212. A TIM 224 may be located between the first contact surface 220 and the upper surface 234 and between the second contact surface 222 and the laterally protruding portion 214. The TIM 224 may exhibit a high thermal conductivity to facilitate heat transfer from the semiconductor device assembly 202' to the heat spreader 200'. For example, the thermal conductivity of the TIM 224 may be greater than about 1.2 W/m·K. More specifically, the thermal conductivity of the TIM 224 may be between about 2 W/m·K and about 200 W/m·K (e.g., about 3.2 W/m·K). The TIM 224 may comprise, for example, a thermal gel (e.g., a silicone-based curable gel), a thermal adhesive, a thermal grease, a phase change material (e.g., a phase change metal alloy), a solder, or a carbon nanotube material. A distance $D_{TIM}$ between the first contact surface 220 and the upper surface 234, which may be the same as, or different from, a distance between the second contact surface 222 and the laterally protruding portion 214, may be, for example, between about 5 µm and about 100 µm. More specifically, the distance $D_{TIM}$ between the first contact surface 220 and the upper surface 234 may be between about 25 µm and about 90 µm (e.g., about 50 µm). In embodiments where the distance $D_{TIM}$ between the first contact surface 220 and the upper surface 234 is different from the distance between the second contact surface 222 and the laterally protruding portion 214, the difference between the distances may be, for example, less than about 50 µm (e.g., about 30 µm). No material other than the TIM 224 may be located between the first contact surface 220 and the upper surface 234 and between the second contact surface 222 and the laterally protruding portion 214.

The heat spreader 200' may be physically attached to the substrate 216 to secure the semiconductor device assembly 202' within the recess 226. For example, a sealant 230 may be positioned between the attachment surfaces 238 of the attachment legs 244 of the heat spreader 200' and the substrate 216 to peripherally attach the heat spreader 200' to the substrate 216 and seal the semiconductor device assembly 202' within the recess 226.

The heat spreader 200' may include multiple trenches 240A and 240B in some embodiments. For example, the heat spreader 200' may include a first trench 240A adjacent the first contact surface 220 and a second trench 240B adjacent the second contact surface 222. The first trench 240A may extend from the first contact surface 220 into the heat spreader 200' toward the topside 242, and the second trench 240B may extend from the second contact surface into the heat spreader 200' toward the topside 242. The first trench 240A may extend around a perimeter of the uppermost semiconductor device 204, and the second trench 240B may extend around a perimeter of the lowermost semiconductor device 212. Excess underfill material 218 extending respectively from and above the uppermost and lowermost semiconductor devices 204 and 212 may be contained within the first and second trenches 240A and 240B.

The depth d of the first trench 240A as measured in a direction perpendicular to the first contact surface 220 may be, for example, between about 5% and about 30% of a height $H_{HS}$ of the heat spreader 200' as measured in the same direction. More specifically, the depth d of the first trench 240A may be, for example, between about 10% and about 20% (e.g., about 15%) of the height $H_{HS}$ of the heat spreader 200'. The width $W_{UT}$ of the first trench 240A as measured in a direction parallel to the first contact surface 220 may be, for example, between about 0.5% and about 25% of the total width $W_{HS}$ of the heat spreader 200' as measured in a direction extending perpendicular to the first contact surface 220. More specifically, the width $W_{UT}$ of the first trench 240A may be, for example, between about 5% and about 15% (e.g., about 10%) of the total width $W_{HS}$ of the heat spreader 200'. The second trench 240B may exhibit the same dimensions as or different dimensions from the first trench 240A, which may be within the ranges of values discussed herein for the first trench 240A.

The height $H_{UM}$ of the excess underfill material 218 extending above the upper surface 234 of the uppermost semiconductor device 204 may be, for example, between about 0.5% and about 25% of the height $H_{HS}$ of the heat spreader 200'. More specifically, the height $H_{UM}$ of the excess underfill material 218 extending above the upper surface 234 of the uppermost semiconductor device 204 may be, for example, between about 3% and about 10% (e.g., about 6%) of the height $H_{HS}$ of the heat spreader 200'. The height of the excess underfill material 218 extending above the laterally protruding portion 214 of the lowermost semiconductor device 212 may be the same as or different from the height $H_{UM}$ of the excess underfill material 218 extending above the upper surface 234 of the uppermost semiconductor device 204, which may be within the ranges of values discussed herein for the excess underfill material 218 extending above the upper surface 234 of the uppermost semiconductor device 204.

A distance $D_{UM}$ the excess underfill material 218 is inserted into the first trench 240A (e.g., the distance $D_{UM}$ between the uppermost portion of the underfill material 218 and the contact surface 220, as measured in a direction perpendicular to the contact surface 220) may be, for example, between about 0.5% and about 30% of the height $H_{HS}$ of the heat spreader 200'. More specifically, the distance $D_{UM}$ the underfill material 218 is inserted into the first trench 240A may be, for example, between about 2.5% and about 10% (e.g., about 6%) of the height $H_{HS}$ of the heat spreader 200'. As specific, nonlimiting examples, the distance $D_{UM}$ the underfill material 218 is inserted into the first trench 240A may be between about 10 µm and about 400 µm (e.g., between about 50 µm and about 100 µm). The distance the excess underfill material 218 is inserted into the second trench 240B may be the same as or different from the distance $D_{UM}$ the underfill material 218 is inserted into the first trench 240A, and may be within the ranges of values discussed herein for the distance $D_{UM}$ the underfill material 218 is inserted into the first trench 240A. The height $H_{HS}$ of the heat spreader 200' may be, for example, between about 1 mm and about 2.5 mm. More specifically, the height $H_{HS}$ of the heat spreader 200' may be, for example, between about 1.5 mm and about 2 mm (e.g., about 1.75 mm).

A surface area of the first contact surface 220 may be, for example, between about 50% and about 100% of a surface area of the upper surface 234 of the uppermost semiconductor device 204 to which the first contact surface 220 is attached. More specifically, the surface area of the first contact surface 220 may be, for example, between about 70% and about 90% (e.g., about 80%) of the surface area of the upper surface 234 of the uppermost semiconductor device 204. The surface area of the second contact surface 222, when compared to the surface area of the laterally protruding portion 214, may be within the same ranges discussed herein for the surface area of the first contact surface 220, when compared to the surface area of the upper surface 234. A laterally inner side surface of the first trench 240A may be laterally inset from a side surface of the uppermost semiconductor device 204, such that the first trench 240A overlaps with the upper surface 234 of the uppermost semiconductor device 204, in some embodiments. In other embodiments, the inner side surface of the first trench 240A may align with (e.g., may be flush with) a peripheral side surface of the uppermost semiconductor device 204, such that the first trench 240A does not overlap with the upper surface 234 of the uppermost semiconductor device 204.

Accordingly, one embodiment of a semiconductor device assembly comprises a heat spreader comprising a contact surface located within a recess on an underside of the heat spreader and a trench adjacent to the contact surface, the trench extending into the heat spreader toward a topside of the heat spreader. A semiconductor device is received within the recess, with a surface of the semiconductor device in physical and thermal contact with the contact surface. Underfill material extends laterally beyond a side of the semiconductor device and at least partially into the trench.

Furthermore, one embodiment of a method of accommodating excess underfill material in a semiconductor device assembly comprises forming a trench in a heat spreader adjacent to a contact surface within a recess on an underside of the heat spreader. A semiconductor device is positioned within the recess, and the contact surface of the heat spreader is physically and thermally attached to a surface or the semiconductor device. Underfill material extending above the surface of the semiconductor device is inserted into the trench.

Figure 7:
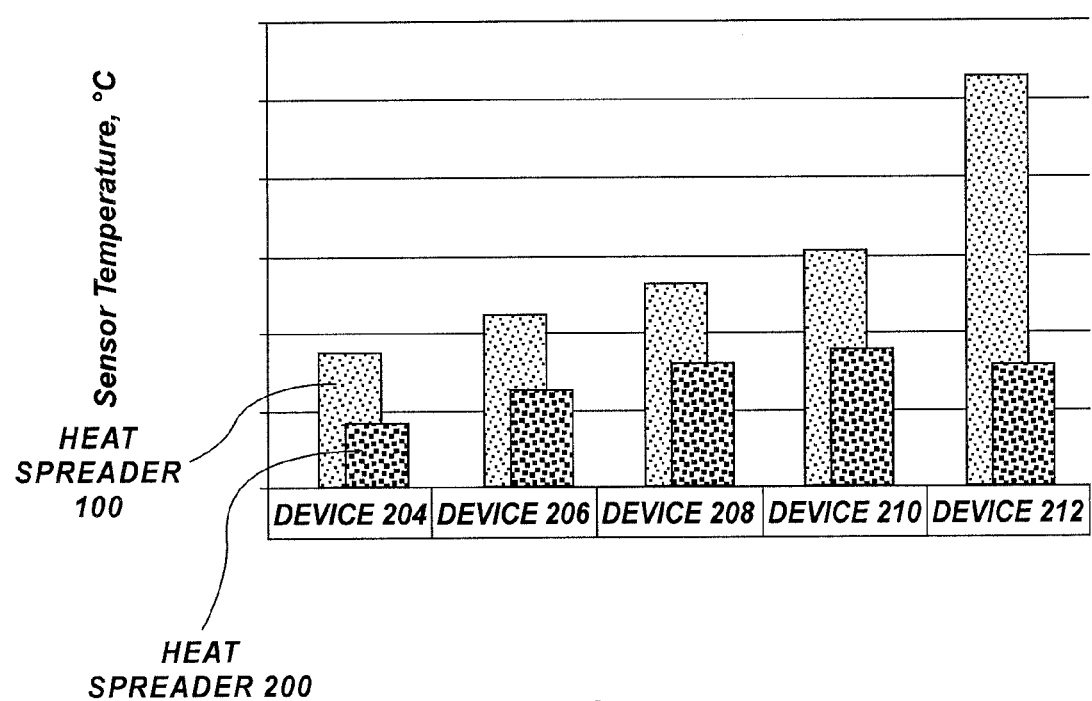
FIG. 7 is a chart comparing the temperature of components of the semiconductor device assembly when used with the heat spreader of FIGS. 4 and 5 with the temperature of the components when used with the heat spreader of FIG. 3.

Referring to FIG. 7, a chart comparing the temperature of components of the semiconductor device assembly 202 of FIG. 3 when used with the heat spreader 200 of FIGS. 4 and 5 with the temperature of the components when used with the heat spreader 100 of FIG. 3. The power ratings for the semiconductor device assemblies 202 (see FIG. 3) were 20 W, with maximum local power density of 30 W/cm$^2$ in certain areas. The thermal conductivity of the underfill material 218 (see FIG. 3) was about 0.5 W/m·K. The thermal conductivity of the TIM 224 (see FIG. 3) was about 3.2 W/m·K. The thermal conductivities of the heat spreaders 100 and 200 (see FIGS. 3 through 5) were about 400 W/m·K. The semiconductor device assemblies 202 (see FIG. 3) were the same, within manufacturing tolerances. A liquid-cooled cold plate and thermoelectric cooling (TEC) were used to control testing case temperature. The respective semiconductor device assemblies 202 were operated at the same power, and for sufficient elapsed time to ensure steady-state operation. The temperature of each component was measured using a temperature sensor integrally built into the circuitry the component. As shown in the chart of FIG. 7, component temperature was reduced by at least 9° C. for each component, with a temperature reduction of 35.5° C. for the lowermost semiconductor device 212, using the heat spreader 200 in comparison to that using heat spreader 100.

While certain illustrative embodiments have been described in connection with the figures, those of ordinary skill in the art will recognize and appreciate that the scope of the disclosure is not limited to those embodiments explicitly shown and described herein. Rather, many additions, deletions, and modifications to the embodiments described herein may be made to produce embodiments within the scope of the disclosure, such as those hereinafter claimed, including legal equivalents. In addition, features from one disclosed embodiment may be combined with features of another disclosed embodiment while still being within the scope of the disclosure, as contemplated by the inventors.

What is claimed is:

1. A heat spreader for dissipating heat from a semiconductor device assembly, comprising:
    a contact surface located within a recess on an underside of the heat spreader, the contact surface being configured to physically and thermally attach to an adjacent semiconductor device; and
    a trench adjacent to the contact surface, the trench extending from the contact surface into the heat spreader toward a topside of the heat spreader, the trench being sized and configured to receive underfill material extending from the semiconductor device assembly above the adjacent semiconductor device into the trench.

2. The heat spreader of claim 1, wherein a width of the trench as measured in a direction parallel to the contact surface is between 0.5% and 25% of a total width of the heat spreader as measured in the same direction.

3. The heat spreader of claim 1, wherein a depth of the trench as measured in a direction perpendicular to the contact surface is between 5% and 30% of a height of the heat spreader as measured in the same direction.

4. A semiconductor device assembly, comprising:
    a heat spreader comprising:
        a contact surface located within a recess on an underside of the heat spreader; and
        a trench adjacent to the contact surface, the trench extending from the contact surface into the heat spreader toward a topside of the heat spreader;
    a semiconductor device received within the recess, a surface of the semiconductor device in physical and thermal contact with the contact surface; and
    underfill material extending laterally beyond a side of the semiconductor device, the underfill material extending at least partially into the trench.

5. The semiconductor device assembly of claim 4, wherein a width of the trench as measured in a direction extending at least substantially parallel to the contact surface is less than 800 μm.

6. The semiconductor device assembly of claim 4, wherein a depth of the trench as measured in a direction extending at least substantially perpendicular to the contact surface is greater than 100 μm.

7. The semiconductor device assembly of claim 4, wherein a surface area of the contact surface is between 50% and 100% of a surface area of a surface of the semiconductor device to which the contact surface is attached.

8. The semiconductor device assembly of claim 4, wherein the trench extends around a perimeter of the contact surface.

9. The semiconductor device assembly of claim 4, wherein a cross-sectional shape of the trench is rectangular.

10. The semiconductor device assembly of claim 4, further comprising a thermal interface material between the contact surface and the semiconductor device.

11. The semiconductor device assembly of claim 10, wherein no material other than the thermal interface material is located between the contact surface and the semiconductor device.

12. The semiconductor device assembly of claim 10, wherein a distance between the contact surface of the heat spreader and the semiconductor device is between 5 µm and 100 µm.

13. The semiconductor device assembly of claim 4, wherein the heat spreader comprises another contact surface located within the recess, the other contact surface being physically and thermally attached to another semiconductor device, wherein the other semiconductor device is located within the recess.

14. The semiconductor device assembly of claim 13, wherein the other semiconductor device is located underneath the semiconductor device, the other semiconductor device comprising a laterally protruding portion extending laterally beyond the semiconductor device, wherein the other contact surface is physically and thermally attached to the other semiconductor device at the laterally protruding portion.

15. The semiconductor device assembly of claim 14, wherein the heat spreader comprises another trench adjacent to the laterally protruding portion of the other semiconductor device, the other trench extending into the heat spreader toward the topside of the heat spreader, wherein underfill material extends from the other semiconductor device into the other trench.

16. The semiconductor device assembly of claim 4, wherein a height of the underfill material extending above an upper surface of the semiconductor device is between 0.5% and 25% of a height of the heat spreader.

17. The semiconductor device assembly of claim 16, wherein the height of the underfill material is between 20 µm and 400 µm.

18. A method of accommodating excess underfill material in a semiconductor device assembly, comprising:
  forming a trench in a heat spreader adjacent to a contact surface within a recess on an underside of the heat spreader, the trench extending from the contact surface into the heat spreader toward a topside of the heat spreader;
  positioning a semiconductor device within the recess;
  physically and thermally attaching the contact surface of the heat spreader to a surface of the semiconductor device; and
  inserting underfill material extending above the surface of the semiconductor device into the trench.

19. The method of claim 18, wherein inserting the underfill material into the trench comprises inserting the underfill material to a depth of between 10 µm and 400 µm into the trench.

20. The method of claim 18, wherein physically and thermally attaching the contact surface of the heat spreader to the semiconductor device comprises attaching the contact surface to between 50% and 100% of a surface area of the surface of the semiconductor device.

* * * * *